(12) United States Patent
Kindaichi et al.

(10) Patent No.: US 11,441,235 B2
(45) Date of Patent: Sep. 13, 2022

(54) CRYSTAL GROWING APPARATUS AND CRUCIBLE HAVING A MAIN BODY PORTION AND A LOW RADIATION PORTION

(71) Applicant: SHOWA DENKO K.K., Tokyo (JP)

(72) Inventors: Rimpei Kindaichi, Chiba (JP); Yoshishige Okuno, Chiba (JP); Tomohiro Shonai, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 76 days.

(21) Appl. No.: 16/702,749

(22) Filed: Dec. 4, 2019

(65) Prior Publication Data

US 2020/0181796 A1 Jun. 11, 2020

(30) Foreign Application Priority Data

Dec. 7, 2018 (JP) .............................. JP2018-230182

(51) Int. Cl.
*C30B 35/00* (2006.01)
*C30B 23/06* (2006.01)
(Continued)

(52) U.S. Cl.
CPC ........ *C30B 23/066* (2013.01); *C23C 14/0635* (2013.01); *C23C 14/243* (2013.01); *C30B 29/36* (2013.01); *C30B 35/002* (2013.01)

(58) Field of Classification Search
CPC ......... C30B 23/00; C30B 23/02; C30B 23/06; C30B 23/066; C30B 29/00; C30B 29/10; C30B 29/36; C30B 35/00; C30B 35/002; C23C 14/0635; C23C 14/243; F27B 14/06; F27B 14/061; F27B 14/08; F27B 14/0837; F27B 14/10; F27B 14/12; F27B 14/20
(Continued)

(56) References Cited

U.S. PATENT DOCUMENTS

2007/0240634 A1* 10/2007 Radkevich ............ C30B 35/002
117/200
2007/0256630 A1* 11/2007 Wang .................... C30B 29/403
117/200
(Continued)

FOREIGN PATENT DOCUMENTS

CN 102906316 A 1/2013
CN 202730295 U * 2/2013
(Continued)

OTHER PUBLICATIONS

Office Action dated Apr. 2, 2021 issued by the Chinese Patent Office in Chinese Application No. 201911230656.1.
(Continued)

*Primary Examiner* — Kenneth A Bratland, Jr.
(74) *Attorney, Agent, or Firm* — Sughrue Mion, PLLC (57) ABSTRACT

A crystal growing apparatus includes: a crucible including a main body portion and a low radiation portion having a radiation rate lower than that of the main body portion; and a heating unit which is positioned on the outside of the crucible and is configured to heat the crucible by radiant heat, and the low radiation portion is provided on an outer surface of a first point which is a heating center, in a case where the crucible does not include the low radiation portion.

17 Claims, 5 Drawing Sheets (51) Int. Cl.
 *C23C 14/24* (2006.01)
 *C23C 14/06* (2006.01)
 *C30B 29/36* (2006.01)

(58) Field of Classification Search
 USPC .......................... 117/84, 200, 204, 937, 951
 See application file for complete search history.

(56) References Cited

U.S. PATENT DOCUMENTS

| | | | | |
|---|---|---|---|---|
| 2008/0107844 | A1* | 5/2008 | Ito | C23C 16/30 |
| | | | | 428/34.1 |
| 2009/0116019 | A1* | 5/2009 | Stoddard | C30B 29/06 |
| | | | | 73/579 |
| 2009/0158994 | A1* | 6/2009 | Miyanaga | C30B 23/005 |
| | | | | 117/200 |
| 2012/0156122 | A1* | 6/2012 | Nishiguchi | C30B 29/36 |
| | | | | 117/84 |
| 2015/0230293 | A1* | 8/2015 | Steinlage | F27B 14/061 |
| | | | | 219/634 |
| 2015/0361580 | A1* | 12/2015 | Huang | C30B 23/02 |
| | | | | 117/109 |
| 2018/0002828 | A1* | 1/2018 | Loboda | C30B 30/00 |

FOREIGN PATENT DOCUMENTS

| | | | | |
|---|---|---|---|---|
| CN | 105239157 A | 1/2016 | | |
| CN | 106012002 A | 10/2016 | | |
| CN | 206418222 U | 8/2017 | | |
| JP | 2008-290885 A | 12/2008 | | |
| JP | 2015-212207 A | 11/2015 | | |
| KR | 10-2013-0083653 A | 7/2013 | | |
| WO | WO-9003952 A1 * | 4/1990 | | C30B 29/06 |

OTHER PUBLICATIONS

Zeng Zhengming, "Industrial Furnace Repair Manual", Machinery Industry Press, Feb. 1998, p. 437 (3 pages).

* cited by examiner

FIG. 6

CRYSTAL GROWING APPARATUS AND CRUCIBLE HAVING A MAIN BODY PORTION AND A LOW RADIATION PORTION

BACKGROUND OF THE INVENTION

Field of the Invention

The present invention relates to a crystal growing apparatus and a crucible.

Priority is claimed on Japanese Patent Application No. 2018-230182, filed on Dec. 7, 2018, the content of which is incorporated herein by reference.

Description of Related Art

Silicon carbide (SiC) has a greater dielectric breakdown field by one digit and a band gap three times greater than those of silicon (Si). In addition, silicon carbide (SiC) has properties such as thermal conductivity approximately three times higher than that of silicon (Si). Accordingly, silicon carbide (SiC) is expected to be applied for a power device, a high frequency device, and a high-temperature operation device. Thus, in recent years, a SiC epitaxial wafer is used in such a semiconductor device.

The SiC epitaxial wafer is manufactured by growing the SiC epitaxial film, which is an active region of a SiC semiconductor device, on a SiC single crystal substrate by chemical vapor deposition (CVD).

The SiC single crystal substrate is manufactured by cutting a SiC single crystal. This SiC single crystal can be generally obtained by a sublimation method. The sublimation method is a method of disposing a seed crystal formed of a SiC single crystal on a pedestal disposed in a graphite crucible, supplying a sublimation gas sublimated from a raw material powder in the crucible to the seed crystal by heating the crucible, and growing the seed crystal to a greater SiC single crystal.

In recent years, demands for an increase in diameter and length of the SiC single crystal are also increased along market demands. In addition, it is also necessary to realize high quality and improve production efficiency of the SiC single crystal, together with an increase in diameter and length of the SiC single crystal.

Japanese Unexamined Patent Application, First Publication No. 2008-290885 discloses that a partition wall portion is provided between heaters divided in a height direction. The partition wall portion controls thermal conduction between the divided heaters, controls radiant heat transferred from the heater to the crucible, and insulates a seed crystal side and a raw material side from each other. A manufacturing device of the silicon carbide single crystal disclosed in Japanese Unexamined Patent Application, First Publication No. 2008-290885 separately controls the seed crystal side and the raw material side of the crucible by the partition wall portion.

Japanese Unexamined Patent Application, First Publication No. 2015-212207 discloses that a heat insulating material which blocks heat from an upper surface of the center of the raw material towards the seed crystal side is disposed in the crucible. The heat insulating material equalizes a temperature of the entire raw material.

SUMMARY OF THE INVENTION

However, the partition wall portion disclosed in Japanese Unexamined Patent Application, First Publication No. 2008-290885 can prevent the thermal conduction between the divided heaters and thermally separate the seed crystal side and the raw material side, but may not control the temperature distribution on the raw material side due to heat radiation. In addition, the heat insulating material disclosed in Japanese Unexamined Patent Application, First Publication No. 2015-212207 is disposed in the crucible and the temperature distribution may not be freely designed.

The invention has been made to address the aforementioned problems and an object thereof is to provide a crystal growing apparatus capable of reducing a temperature distribution generated in a raw material contained in a crucible.

As a result of intensive study, the inventors found that, by setting the radiation rate on a predetermined portion of a crucible to be lower than that on the other portion, the temperature distribution in the vicinity of the highest-temperature portion of the crucible can be spread in a vertical direction and the temperature distribution generated in the raw material contained in the crucible reduces. That is, the invention provides the following means, for solving the aforementioned problems.

(1) A crystal growing apparatus according to a first aspect includes: a crucible including a main body portion and a low radiation portion having a radiation rate lower than that of the main body portion; and a heating unit which is positioned on the outside of the crucible and is configured to heat the crucible by radiant heat, and the low radiation portion is provided on an outer surface of a first point which is a heating center of the crucible, in a case where the crucible does not include the low radiation portion.

(2) In the crystal growing apparatus according to (1), the radiation rate of the low radiation portion may be 0.6 times or less than the radiation rate of the main body portion.

(3) In the crystal growing apparatus according to (1) or (2), the main body portion may be graphite, and the low radiation portion may be a simple substance, carbide, or nitride including an element selected from the group consisting of Ta, Mo, Nb, Hf, W, and Zr, or a mixture thereof.

(4) In the crystal growing apparatus according to any one of (1) to (3), an outer surface of the main body portion may have ruggedness and an outer surface of the low radiation portion may be a flat surface.

(5) In the crystal growing apparatus according to any one of (1) to (4), the height of the low radiation portion may be 2 times or more than a distance of a perpendicular line drawn down to the heating unit from the first point.

(6) In the crystal growing apparatus according to any one of (1) to (5), the height of the low radiation portion may be 40% or more of the height of a raw material contained in the crucible.

(7) A crucible according to a second aspect includes: a main body portion; and a low radiation portion having a radiation rate lower than that of the main body portion, the low radiation portion covers a part of an outer surface which is lower than a surface position of a raw material contained in the crucible.

According to the crystal growing apparatus according to the aspect, it is possible to reduce a temperature distribution generated in the raw material contained in the crucible.

DETAILED DESCRIPTION OF THE INVENTION

Hereinafter, a crystal growing apparatus and a crucible according to embodiments will be described in detail suitably with reference to the drawings. The drawings used in the following description may show enlarged characteristic parts for convenience for easy understanding of the characteristics of the invention, and a dimensional rate and the like of each constituent element may be different from the actual values. Materials, dimensions, and the like shown in the following description are merely examples, the invention is not limited thereto, and modifications can be suitably performed within a range not departing from the gist thereof.

Crystal Growing Apparatus

Figure 1:
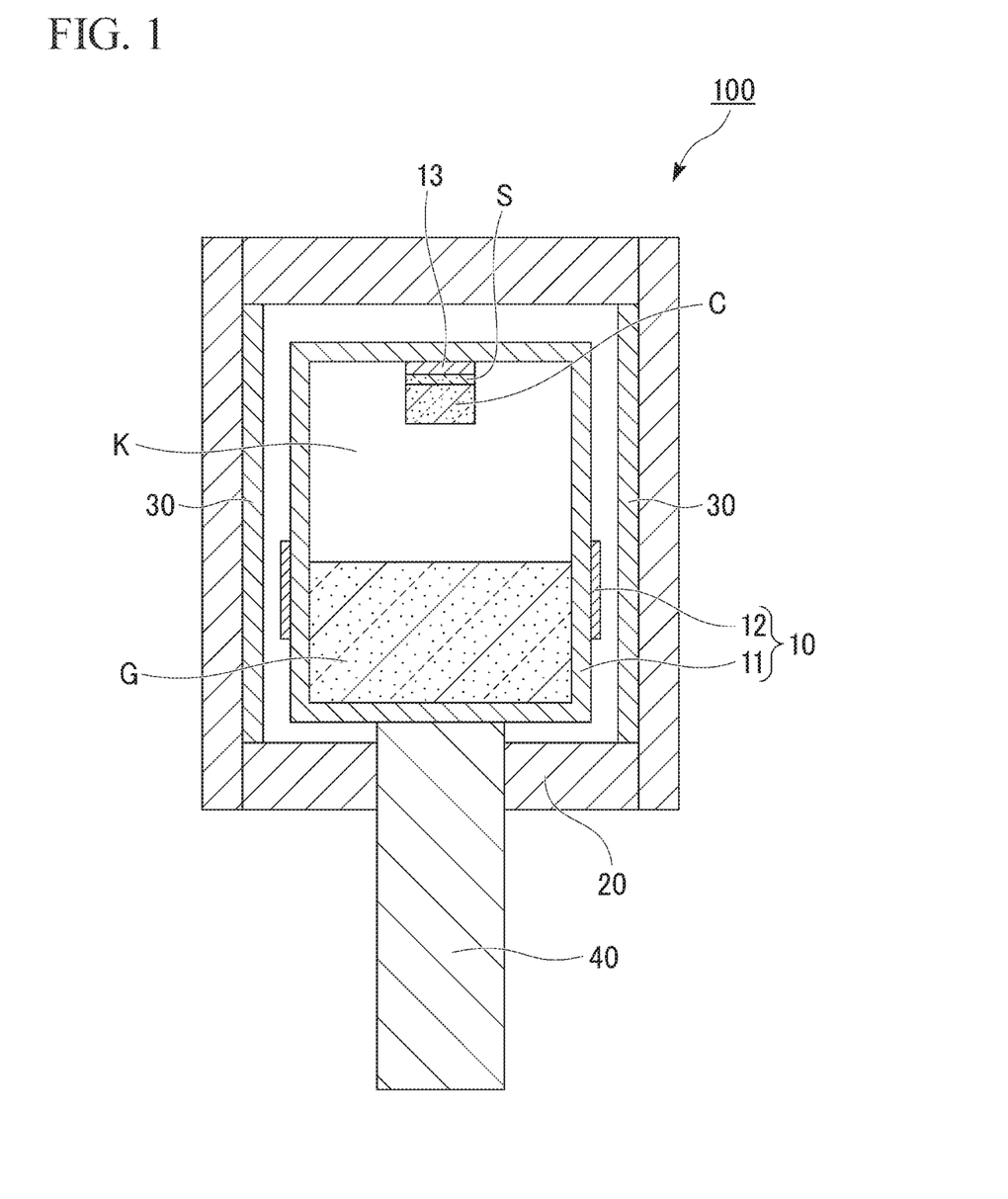
FIG. 1 is a cross-sectional schematic view of a crystal growing apparatus according to a first embodiment.

FIG. 1 is a cross-sectional schematic view of a crystal growing apparatus according to a first embodiment. A crystal growing apparatus 100 shown in FIG. 1 includes a crucible 10, a heat insulating material 20, a heating unit 30, and a support 40. In FIG. 1, for easy understanding, a raw material G, a seed crystal S, and a single crystal C crystal-grown on the seed crystal S are shown at the same time.

In the following drawings, a perpendicular direction to a support surface on which the crucible 10 is supported by the support 40 is set as a vertical direction, and a direction orthogonal to the vertical direction is set as a radial direction. FIG. 1 is a cross-sectional view cut to have a random cross section along a center axis of the support 40.

The crucible 10 surrounds a growth space K for crystal growing of the single crystal C. The crucible 10 includes a main body portion 11, a low radiation portion 12, a crystal installation portion 13. A bottom portion of the crucible 10 is filled with the raw material G, in a case of the crystal growing of the single crystal C by a sublimation method. The crystal installation portion 13 is on a position facing the raw material G. The seed crystal S is installed on the crystal installation portion 13, in a case of the crystal growing of the single crystal C by the sublimation method. A raw material gas sublimated from the raw material G is re-crystallized on the surface of the seed crystal S, thereby the single crystal C grown.

The main body portion 11 is a portion surrounding the growth space K. The main body portion 11 is formed of a material capable of withstand a high temperature, in a case of growing the single crystal C. The main body portion 11 is, for example, composed of a graphite. A sublimation of the graphite is extremely high as 3,550° C. and the graphite can withstand a high temperature during the growing.

The low radiation portion 12 is a portion having a radiation rate lower than that of the main body portion 11. The radiation rate is also referred to as an emissivity. The radiation rate is a rate of an energy radiated by an object by the heat radiation to an energy radiated by a black body at the same temperature, in a case where the energy radiated by a black body is assumed as 1. In a case where the radiation rate is high, the heat absorption is easily performed, and in a case where the radiation rate is low, the heat absorption is hardly performed. The low radiation portion 12 is, for example, preferably 0.6 times or less and more preferably 0.4 times or less the radiation rate of the main body portion 11. The low radiation portion 12 is preferably 0.1 times or more the radiation rate of the main body portion 11.

The low radiation portion 12 is composed of a simple substance, carbide, or nitride including an element selected from the group consisting of Ta, Mo, Nb, Hf, W, and Zr, or a mixture thereof. The low radiation portion 12 is, for example, TaC, Ta, Mo, Mo$_2$C, W, WC, Nb, or NbC. The radiation rate of TaC depends on a shape or a roughness of a surface, oxidation, a measurement temperature, or a measurement wavelength, and is, for example, 0.1 to 0.5. The radiation rate of W is, for example, 0.1 to 0.4, and the radiation rate of Mo is, for example, 0.1 to 0.4. The radiation rate of the graphite is, for example, 0.7 to 0.95, and the radiation rate is higher than that of these materials.

Figure 2:
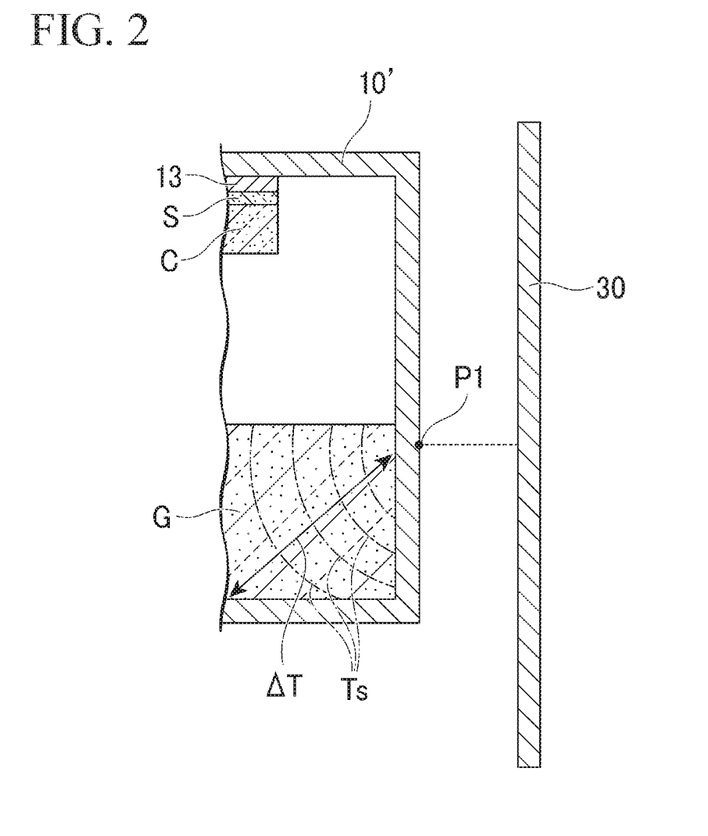
FIG. 2 is a cross-sectional schematic view showing a function of a crystal growing apparatus not including a low radiation portion.

The low radiation portion 12 covers an outer surface of a first point of the crucible 10. A first point P1 will be described with reference to FIG. 2. FIG. 2 is a cross-sectional schematic view of a crystal growing apparatus not including the low radiation portion. A crucible 10' shown in FIG. 2 is different from the crucible 10 shown in FIG. 1 in that the low radiation portion 12 is not included.

The heating unit 30 extends in the vertical direction so as to heat the entire crucible 10'. The crucible 10' is indirectly heated by the heating unit 30 having a height in the vertical direction. A heating state of a side surface of the crucible 10' in the radial direction is not uniform, and a temperature distribution is generated in a height direction.

The first point P1 is a position which is a heating center where the temperature is the highest in the crucible 10'. In a case where the heating unit 30 is uniform in the height direction, for example, a position facing the center of the heating unit 30 in the vertical direction may be the first point P1. That is, the first point P1 is a position which is the heating center, in a case where the crucible 10 shown in FIG. 1 does not include the low radiation portion 12.

The first point P1 is positioned lower than a surface position of the raw material G contained in the crucible 10. By positioning the heating center around the raw material, a sublimation efficiency of the raw material G increases. The low radiation portion 12 covers at least a part of the outer surface lower than the surface position of the raw material G contained in the crucible 10.

Figure 3:
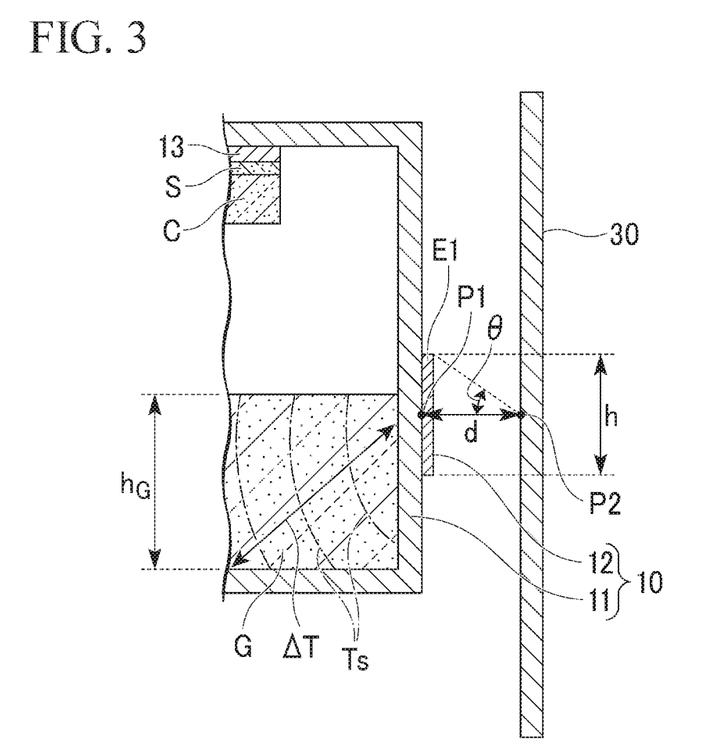
FIG. 3 is a cross-sectional schematic view showing a function of the crystal growing apparatus according to the first embodiment.

FIG. 3 is a cross-sectional schematic view of the crystal growing apparatus according to the first embodiment. The low radiation portion 12 covers the outer surface of the first point P1 of the crucible 10, and the surface of the low radiation portion 12 is exposed to the outer surface of the crucible 10. The outer surface of the crucible 10 is a surface to which heat radiation from the heating unit 30 is incident. The state of the outer surface of the crucible 10 is different between the main body portion 11 and the low radiation portion 12, and accordingly, a difference is generated in the temperature distribution in the crucible 10.

The height h of the low radiation portion 12 is preferably 2 times or more the length d of a perpendicular line drawn down to the heating unit 30 from the first point P1, and more preferably 2 times or more and 4 times or less. An intersection of the perpendicular line drawn down to the heating unit 30 from the first point P1 and the heating unit 30 is set as a second point P2, an end of the low radiation portion 12 in the vertical direction is set as a first end E1, and an angle formed by a line segment connecting the first point P1 and the second point P2 and a line segment connecting the second point P2 and the first end E1 is set as θ. In a case where the relationship is satisfied, tan θ≥1 is satisfied.

The height h of the low radiation portion 12 does not depend on a distance to the heating unit 30, and is preferably 40% or more and more preferably 60% or more of a height of the raw material G contained in the crucible 10. The height h of the low radiation portion 12 is preferably 80% or less of the height of the raw material G contained in the crucible 10.

The heat insulating material 20 covers the surrounding of the crucible 10 and the heating unit 30 (see FIG. 1). A temperature of the crucible 10 is maintained by the heat insulating material 20.

The heat insulating material 20 is preferably configured with a material having a thermal conductivity equal to or smaller than 10 W/mK at a high temperature equal to or higher than 2,000° C. As the material having a thermal conductivity equal to or smaller than 10 W/mK at a high temperature equal to or higher than 2,000° C., a felt material including graphite and carbon as main components is used. In addition, the heat insulating material 20 is desirably a member having a thermal conductivity equal to or smaller than 5 W/mK.

The heating unit 30 is positioned on an outer side of the crucible 10. The heating unit 30 shown in FIG. 1 is positioned on an outer side of the crucible 10 in the radial direction and on an inner side of the heat insulating material 20 in the radial direction. The heating unit 30 is heated by induction heating by a coil (not shown) positioned on an outer periphery of the heat insulating material 20. The heat-generated heating unit 30 is a generation source of the heat radiation and heats the crucible 10 by the radiant heat. The heating unit 30 is, for example, a graphite member. The heating unit 30 is also referred to as a heater.

The support 40 is positioned on a lower portion of the crucible 10 and supports the crucible 10. The support 40 can rotate in the radial direction. In a case where the support 40 rotates in the radial direction by a driving device (not shown) and the crucible 10 also rotates with the support 40.

According to the crystal growing apparatus 100 according to the first embodiment, it is possible to reduce the temperature distribution generated in the raw material G contained in the crucible 10. A reason therefor will be described with reference to FIGS. 2 and 3.

The crucible 10' shown in FIG. 2 does not include the low radiation portion 12, and the heating center and the first point P1 coincides with each other. The temperature distribution in the raw material G is generated to be spread from the first point P1. An isothermal surface Ts in the raw material G is radially formed around the first point P1 at the highest temperature. A temperature difference ΔT is generated in the raw material G. The temperature difference ΔT is a difference between the highest temperature and the lowest temperature in the raw material G. In a case of FIG. 2, regarding the raw material G, the temperature in the vicinity of the first point P1 is the highest temperature, and the temperature in the vicinity of the center of the bottom portion of the crucible 10' separated from the first point P1 is the lowest temperature. The temperature of the upper end of the raw material G may also be the lowest temperature due to the position of the heating center.

A raw material gas from the raw material G flows in accordance with the temperature difference in the crucible 10' and re-crystallized with the seed crystal S. A part of the sublimated raw material gas also flows to the vicinity of the center of the bottom portion of the crucible 10' in accordance with the temperature difference ΔT in the raw material G. The raw material gas supplied to the vicinity of the center of the bottom portion of the crucible 10' is not used in the crystal growth. In addition, the raw material re-crystallized in the vicinity of the center of the bottom portion of the crucible 10' does not function as the raw material. A size of the crucible 10' in the radial direction increases along an increase in diameter of the SiC single crystal. As the size of the crucible 10' in the radial direction is great, the temperature difference ΔT in the raw material G increases.

With respect to this, the crucible 10 shown in FIG. 3 include the low radiation portion 12 on the outer surface of the first point P1. The low radiation portion 12 hardly receives radiation and is hardly heated compared to the main body portion 11. As a result, a temperature gradient in the vertical direction in the vicinity of the heating center of the crucible 10 is relaxed. That is, the gradient of the temperature distribution spread in the vertical direction around the first point P1 is relaxed and the temperature in the vicinity of the first point P1 is homogenized.

In a case where the temperature gradient in the vertical direction in the vicinity of the heating center is relaxed, the shape of the isothermal surface Ts in the raw material G changes. The isothermal surface Ts is radially formed from the heating center. Since the heating center is spread in the vertical direction, the area of one temperature range surrounding two isothermal surfaces Ts is greater than that in the case of FIG. 2. Accordingly, the temperature difference ΔT in the raw material G is smaller than that in a case where the low radiation portion 12 is not included. As the temperature difference ΔT in the raw material is small, a supply efficiency of the raw material gas to the seed crystal S increases.

Second Embodiment

Figure 4:
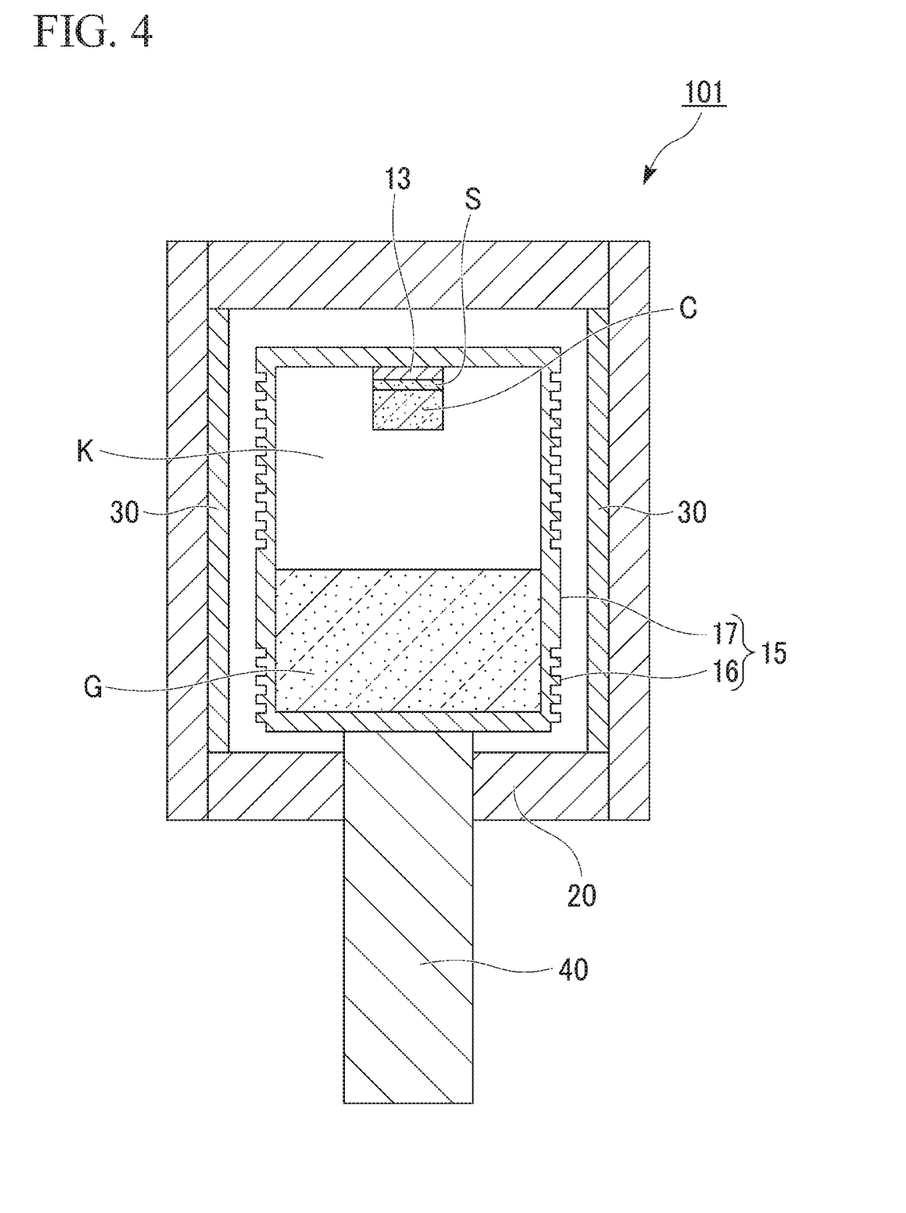
FIG. 4 is a cross-sectional schematic view of a crystal growing apparatus according to a second embodiment.

FIG. 4 is a cross-sectional schematic view of a crystal growing apparatus 101 according to a second embodiment. In the crystal growing apparatus 101, a configuration of a crucible 15 is different from the crucible 10 of the crystal growing apparatus 100. The other configurations are the same, the same reference numerals are used for the same configurations, and the description thereof is omitted.

The crucible 15 shown in FIG. 4 includes a main body portion 16 and a low radiation portion 17. The ruggedness is formed on an outer surface (outer side surface) of the main body portion 16. With respect to this, the outer surface of the low radiation portion 17 is a flat surface.

The radiation rate also changed in accordance with the surface state of an object. In a case where the ruggedness is formed on the surface of the object, an effective radiation rate of the portion increases. It is because that the area for absorbing radiation light (radiant heat) from the heating unit 30 is increased. That is, the low radiation portion 17 has a radiation rate lower than that of the main body portion 16 due to a difference of the surface shape.

The main body portion 16 and the low radiation portion 17 may be formed of the same material or may be formed of different materials. The material used for the main body portion 16 and the low radiation portion 17 is the same as that for the main body portion 11 and the low radiation portion 12 of the first embodiment. For example, both the material used for the main body portion 16 and the low radiation portion 17 are formed of graphite and only the surface shape may be different from each other.

The low radiation portion 17 is provided on an outer surface of the heating center, in a case where the low radiation portion 17 is not included. The low radiation portion 17 hardly receives radiation and is hardly heated compared to the main body portion 16. As a result, a temperature gradient in the vertical direction in the vicinity of the heating center of the crucible 15 is relaxed, and the temperature difference ΔT in the raw material G is further decreased, compared to a case where the low radiation portion 17 is not included. As the temperature difference ΔT in the raw material is small, a supply efficiency of the raw material gas to the seed crystal S increases.

Hereinabove, the preferred embodiments of the invention has been described, but the invention is not limited to the specific embodiments, and various modifications and changes can be performed within a range of the gist of the invention described in claims.

EXAMPLES

Example 1

The configuration shown in FIG. 3 was reproduced with a simulation, and a temperature difference generated in a raw material while heating the crucible was obtained. In the simulation, the thermal analysis by a finite element method using ANSYS Mechanical was performed.

The simulation was performed only with a structure of a half (half in the radial direction) of any cross section passing through the center axis, in order to reduce calculation load. For simplification, the simulation was performed by modelling only the crucible filled with only the raw material and the heating unit. The conditions of the simulation were as shown below.

Crucible outer radius: 150 mm
Crucible thickness: 10 mm
Raw material portion height: 200 mm
Radiation rate of main body portion of crucible: 0.8 (corresponding to graphite)
Crucible thermal conductivity: 40 W/mK
Raw material thermal conductivity: 3 W/mK
Radiation rate of heating unit: 0.8
Heating unit inner radius: 180 mm (distance d between heating unit and crucible: 30 mm)
Position of first point (heating center): 100 mm from bottom surface (half of raw material height), same height as center position of heating unit in height direction
Center temperature of heating unit: 2,450° C.
Temperature of end of heating unit: 2,250° C.
Height of low radiation portion: 100 mm
Position of low radiation portion: center of low radiation portion in height direction coincides with height position of first point
Radiation rate of low radiation portion: 0.2 (corresponding to TaC)

The simulation was performed under the conditions described above, and the temperature difference ΔT generated in the raw material of the crystal growing apparatus of Example 1 was 147.5° C.

Comparative Example 1

The configuration shown in FIG. 2 was reproduced with a simulation, and a temperature difference generated in a raw material while heating the crucible was obtained. The method and the conditions of the simulation were the same as in Example 1, except that the low radiation portion was not provided.

The simulation was performed under the conditions described above, and the temperature difference ΔT generated in the raw material of the crystal growing apparatus of Comparative Example 1 was 155.4° C.

The temperature difference ΔT in the raw material of the crystal growing apparatus of Example 1 was smaller than that of the crystal growing apparatus of Comparative Example 1 by 7.9 degrees.

Example 2

Example 2 was the same as in Example 1, except that the relationship between the radiation rates of the main body portion and the low radiation portion of the crucible was changed.

Figure 5:
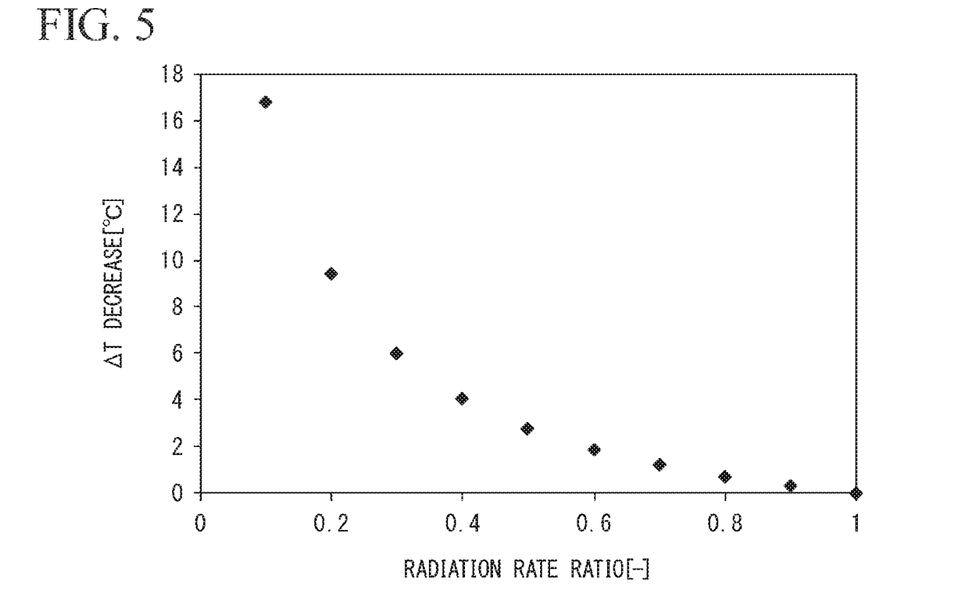
FIG. 5 is a graph showing a result of Example 2.

FIG. 5 is a graph showing a result of Example 2. The horizontal axis is the ratio of the radiation rates of the main body portion and the low radiation portion and is a value obtained by dividing the radiation rate of the low radiation portion by the radiation rate of the main body portion. As the value of the horizontal axis increases, the difference in radiation rate between the main body portion and the low radiation portion increases. A vertical axis indicates the amount of a decrease in the temperature difference ΔT with respect to the temperature difference ΔT generated in the raw material, in a case where the low radiation portion is not included. As the numerical value of the vertical axis is great, the temperature difference ΔT in the raw material further decreases, compared to a case where the low radiation portion is not included.

As shown in FIG. 5, as the difference in radiation rate between the main body portion and the low radiation portion of the crucible is great, the temperature difference ΔT in the raw material decreases. In a case where the radiation rate of the low radiation portion is 0.6 times or less the radiation rate of the main body portion, the temperature difference ΔT in the raw material was smaller than that in a case where the low radiation portion is not included, by approximately 2° C. In a case where the temperature difference ΔT in the raw material is decreased by 2 degrees, the sublimation amount in case where the crystal growth is continued for 150 h or longer increases by approximately 8% to 9%.

Example 3

Example 3 was the same as in Example 1, except that the relationship between the distance between the crucible and the heating unit and the height of the low radiation portion was changed.

Figure 6:
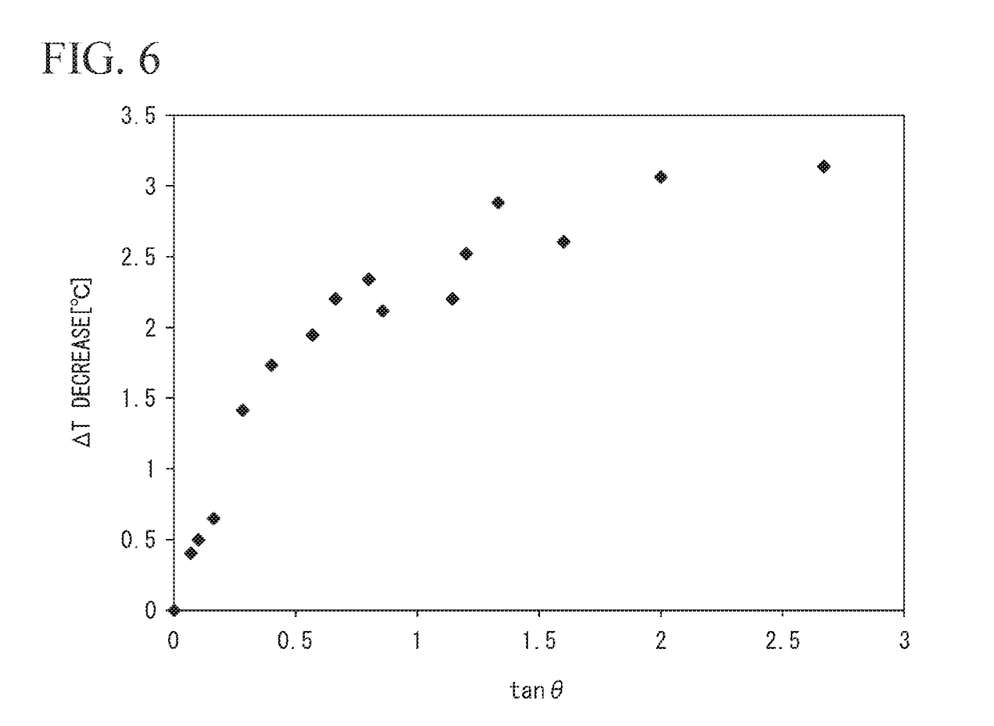
FIG. 6 is a graph showing a result of Example 3.

The height h of the low radiation portion was changed between 0 mm (corresponding to Comparative Example 1) to 160 mm. The distance d between the crucible and the heating unit was set any of 30 mm, 50 mm, and 70 mm. An intersection of the perpendicular line drawn down to the heating unit 30 from the first point P1 and the heating unit 30 is set as a second point P2, an end of the low radiation portion 12 in the vertical direction is set as a first end E1, and an angle formed by a line segment connecting the first point P1 and the second point P2 and a line segment connecting the second point P2 and the first end E1 is set as θ (see FIG. 3). That is, $\tan\theta = (h/2)/d$ FIG. 6 is a graph showing a result of Example 3. A horizontal axis is tan θ described above. The vertical axis indicates the amount of a decrease in the temperature difference ΔT with respect to the temperature difference ΔT generated in the raw material, in a case where the low radiation portion is not included. As the numerical value of the vertical axis increases, the temperature difference ΔT in the raw material further decreases, compared to a case where the low radiation portion is not included.

In a case where the relationship between the distance of the crucible and the heating unit and the height of the low radiation portion satisfies tan θ≥1, the temperature difference ΔT in the raw material was smaller than that in a case where the low radiation portion is not included, by approximately 2° C. In a case where the temperature difference ΔT in the raw material is decreased by 2 degrees, the sublimation amount in case where the crystal growth is continued for 150 h or longer increases by approximately 8% to 9%.

Reference Examples 1 to 4

A relationship between the temperature difference in the raw material and the sublimation amount of the raw material gas was obtained by the simulation. The crystal growth simulation was performed using Virtual Reactor PVT-SiC manufactured by STR. The simulation was performed only with a structure of a half (half in the radial direction) of any cross section passing through the center axis, in order to reduce calculation load. The result thereof is shown in Table 1.

TABLE 1

|  | Difference ΔT (° C.) | Rate of increase | | | | | |
|---|---|---|---|---|---|---|---|
|  |  | Initial stage | 20 h | 50 h | 100 h | 150 h | 200 h |
| Reference Example 1 | 0.0 | 0.0 | 0.0 | 0.0 | 0.0 | 0.0 | 0.0 |
| Reference Example 2 | −1.9 | 0.0 | 1.4 | 0.7 | 0.9 | 7.9 | 9.8 |
| Reference Example 3 | −2.8 | 1.9 | 2.3 | 2.5 | 3.3 | 9.1 | 9.3 |
| Reference Example 4 | −3.9 | 3.8 | 8.2 | 4.6 | 5.9 | 8.4 | 8.3 |

In Table 1, the difference ΔT shows the amount of change of the temperature difference ΔT in the raw material based on the temperature difference ΔT in the raw material of Reference Example 1. That is, in a case where the temperature difference ΔT in the raw material of Reference Example 1 is A° C., the temperature difference ΔT in the raw material of Reference Example 2 is A−1.9° C., the temperature difference ΔT in the raw material of Reference Example 3 is A−2.8° C., and the temperature difference ΔT in the raw material of Reference Example 2 is A−3.9° C. The sublimation amounts of the raw material gas were respectively obtained in the initial stage of the crystal growth (approximately 0 hour), after 20 hours, after 50 hours, after 100 hours, after 150 hours, and after 200 hours. In Table 1, a rate of increase in the sublimation amount of each reference example was obtained, in a case where the sublimation amount of Reference Example 1 was set as a reference. As shown in Table 1, in a case where the temperature difference ΔT in the raw material decreases, the sublimation efficiency of the raw material gas is improved.

EXPLANATION OF REFERENCES 10, 15: crucible
11, 16: main body portion
12, 17: low radiation portion
13: crystal installation portion
20: heat insulating material
30: heating unit
40: support
100, 101: crystal growing apparatus
S: seed crystal
C: single crystal
K: growth space
G: raw material
P1: first point
P2: second point
E1: first end
Ts: isothermal surface

What is claimed is:

1. A crystal growing apparatus comprising:
   a crucible including a main body portion, a low radiation portion having a radiation rate lower than that of the main body portion, a crystal installation portion on which a seed crystal is installed, and a bottom portion which is filled with a raw material; and
   a heating unit which is positioned on the outside of the crucible and is configured to heat the crucible by radiant heat,
   wherein the low radiation portion is provided on an outer surface of a first point which is a heating center of the crucible, in a case where the crucible does not include the low radiation portion,
   the crystal installation portion is disposed on a position facing the raw material, and
   a height of the low radiation portion is 2 times or more and 4 times or less than a distance of a perpendicular line drawn towards the heating unit from the first point.

2. The crystal growing apparatus according to claim 1, wherein a radiation rate of the low radiation portion is 0.6 times or less than a radiation rate of the main body portion.

3. The crystal growing apparatus according to claim 1, wherein the main body portion is composed of graphite, and
   the low radiation portion is composed of an element, carbide, or nitride including an element selected from the group consisting of Ta, Mo, Nb, Hf, W, and Zr, or a mixture thereof.

4. The crystal growing apparatus according to claim 1, wherein an outer surface of the main body portion is uneven, and
   an outer surface of the low radiation portion is a flat surface.

5. The crystal growing apparatus according to claim 1, wherein the height of the low radiation portion is 40% or more and 80% or less of a height of the raw material contained in the crucible.

6. The crystal growing apparatus according to claim 1, further comprising:
   a support,
   wherein the support is positioned on a lower portion of the crucible and supports the crucible, and
   the support rotates in a radial direction.

7. The crystal growing apparatus according to claim 1, further comprising:
   a heat insulating material,
   wherein the heat insulating material is a member having a thermal conductivity equal to or smaller than 5 W/mK.

8. The crystal growing apparatus according to claim 6, further comprising:
   a heat insulating material,
   wherein the heat insulating material is a member having a thermal conductivity equal to or smaller than 5 W/mK.

9. The crystal growing apparatus according to claim 8, wherein the support passes through the heat insulating material and projects downward from the crucible.

10. A crystal growing apparatus comprising:
- a crucible including a main body portion, a low radiation portion having a radiation rate lower than that of the main body portion, a crystal installation portion on which a seed crystal is installed, and a bottom portion which is filled with a raw material; and
- a heating unit which is positioned on the outside of the crucible and is configured to heat the crucible by radiant heat,
- wherein the low radiation portion is provided on an outer surface of a first point which is a heating center of the crucible, in a case where the crucible does not include the low radiation portion,
- the crystal installation portion is disposed on a position facing the raw material, and
- a height of the low radiation portion is 40% or more and 80% or less of a height of the raw material contained in the crucible.

11. The crystal growing apparatus according to claim 10, wherein a radiation rate of the low radiation portion is 0.6 times or less than a radiation rate of the main body portion.

12. The crystal growing apparatus according to claim 10, wherein the main body portion is composed of graphite, and the low radiation portion is composed of an element, carbide, or nitride including an element selected from the group consisting of Ta, Mo, Nb, Hf, W, and Zr, or a mixture thereof.

13. The crystal growing apparatus according to claim 10, wherein an outer surface of the main body portion is uneven, and
an outer surface of the low radiation portion is a flat surface.

14. The crystal growing apparatus according to claim 10, further comprising:
a support, wherein,
the support is positioned on a lower portion of the crucible and supports the crucible, and
the support rotates in a radial direction.

15. The crystal growing apparatus according to claim 10, further comprising:
a heat insulating material, wherein,
the heat insulating material is a member having a thermal conductivity equal to or smaller than 5 W/mK.

16. The crystal growing apparatus according to claim 14, further comprising:
a heat insulating material, wherein,
the heat insulating material is a member having a thermal conductivity equal to or smaller than 5 W/mK.

17. The crystal growing apparatus according to claim 16, wherein the support passes through the heat insulating material and projects downward from the crucible.

* * * * *